(12) United States Patent
Spartiotis et al.

(10) Patent No.: US 7,741,610 B2
(45) Date of Patent: Jun. 22, 2010

(54) CDTE/CDZNTE RADIATION IMAGING DETECTOR AND HIGH/BIASING VOLTAGE MEANS

(75) Inventors: Konstantinos Spartiotis, Espoo (FI); Tom Schulman, Monninkyla (FI); Tuomas Pantsar, Espoo (FI)

(73) Assignee: Oy Ajat Ltd., Espoo (FI)

( * ) Notice: Subject to any disclaimer, the term of this patent is extended or adjusted under 35 U.S.C. 154(b) by 0 days.

(21) Appl. No.: 11/933,497

(22) Filed: Nov. 1, 2007

(65) Prior Publication Data

US 2009/0114831 A1    May 7, 2009

(51) Int. Cl.
*H01L 27/146* (2006.01)
(52) U.S. Cl. ................................. 250/370.13
(58) Field of Classification Search ............. 250/370.13
See application file for complete search history.

(56) References Cited

U.S. PATENT DOCUMENTS

| | | | | |
|---|---|---|---|---|
| 4,255,659 A * | 3/1981 | Kaufman et al. | ....... | 250/370.09 |
| 4,358,681 A * | 11/1982 | Ando | ........................... | 250/324 |
| 5,347,131 A * | 9/1994 | Charpak | .................. | 250/385.1 |
| 5,473,163 A | 12/1995 | Schmidt et al. | | |
| 5,917,185 A * | 6/1999 | Yeung et al. | ................. | 250/288 |
| 6,011,264 A * | 1/2000 | Lachish et al. | ......... | 250/370.13 |
| 7,071,454 B2 * | 7/2006 | Iwakiri | .................... | 250/208.1 |
| 2005/0051731 A1 * | 3/2005 | Sato et al. | .............. | 250/370.01 |
| 2006/0192133 A1 * | 8/2006 | Risse et al. | ............. | 250/396 R |
| 2009/0050813 A1 | 2/2009 | Sato et al. | | |

FOREIGN PATENT DOCUMENTS

| | | |
|---|---|---|
| DE | 43 40 389 C1 | 11/1994 |
| JP | 4-061173 A | 2/1992 |
| WO | 02/067014 A1 | 8/2002 |
| WO | 05/103761 A1 | 11/2005 |
| WO | 2007/096967 A1 | 8/2007 |

OTHER PUBLICATIONS

International Search Report, dated Feb. 1, 2010, from corresponding PCT application.
V. Gostilo et al., "Tecnological aspects of development of pixel and strip detectors based on CdTe and CdZnTe", Nuclear Instruments & Methods in Physics Research, Mar. 11, 2001, pp. 27-34, vol. 460, No. 1, Elsevier Science B. V.; Cited in International Search Report.
A. Meuris et al., "Caliste 64, an innovative CdTe hard X-ray microcamera", Nuclear Science Symposium Conference, Jan. 22, 2008, pp. 2551-2557; Cited in International Search Report.

* cited by examiner

*Primary Examiner*—David P Porta
*Assistant Examiner*—Mindy Vu
(74) *Attorney, Agent, or Firm*—Young & Thompson

(57) ABSTRACT

A CdTe or CdZnTe radiation imaging detector and high voltage bias part for applying a high voltage to the continuous electrode to ensure stable performance of the detector. The high voltage bias part includes conductors of >30 um diameter and preferably selected from a group of materials that do not oxidize easily or oxidize less than aluminium.

20 Claims, 3 Drawing Sheets

CDTE/CDZNTE RADIATION IMAGING DETECTOR AND HIGH/BIASING VOLTAGE MEANS

BACKGROUND OF THE INVENTION

1. Field of the Invention

The present invention relates to radiation detection and to digital radiation imaging where the detected radiation energy is in excess of 5 keV and typically in the range 5 keV-1 MeV. In particular, the invention relates to a method of connecting a high voltage or a biasing voltage to the surface of a compound semiconductor radiation detector.

2. Description of Related Art

A semiconductor radiation detector requires a high/bias voltage on one of its surfaces to produce an electric field inside the semiconductor detector crystal. The electric field is necessary to ensure effective collection of the signal charge (electrons and holes) created in the crystal by incident radiation (X- or gamma rays or particle radiation). Conventionally the high voltage contact is provided with a thin aluminum wire with a thickness of typically 10-25 µm. The wire is generally attached by ultrasonic bonding. Other means of providing the high voltage connection between the detector surface and the Al wire include conductive epoxy or a metal spring which is brought into contact with the detector surface by mechanical pressure. These conventional means of contacting the high voltage work well in certain applications and for certain types of semiconductor detectors.

In applications where the incident radiation enters the detector crystal from the low voltage (ground/signal) side, the high voltage can be connected by means of conductive epoxy which provides electrical contact between the detector surface and the supporting substrate such as a printed circuit board (PCB). A thin aluminum wire is perfectly suitable as a high voltage connector for detectors made of silicon which is a highly mature semiconductor of well defined and stable properties.

In applications which require the high/bias voltage surface of the detector to remain bare in order to freely receive radiation, any conventional metal springs or similar means which covers all or part of the detector surface cannot be used to connect the detector high voltage. Likewise in such applications the high voltage surface cannot be glued with epoxy to a substrate. Instead, a thin wire which covers only a very small spot of the detector high voltage surface is preferred.

An example of an application requiring the detector high/bias voltage surface to remain bare is radiation imaging with hybrid detectors consisting of a semiconductor crystal (i.e., detector) bump bonded to an integrated readout circuit.

SUMMARY OF THE INVENTION

In accordance with one aspect of the current invention there is provided a radiation imaging/radiation detection, direct conversion, compound semiconductor detector, said detector comprising two major faces, a first face for reading out the electronic signal created in response to incident radiation and a second face for applying high voltage biasing means, where the bias means comprises a copper, gold, silver or platinum conductor or electrically conductive epoxy, plastic or rubber.

In accordance with a second aspect of the current invention there is provided a radiation imaging/radiation detection, direct conversion, compound semiconductor detector, said detector comprising two major faces, a first face for reading out the electronic signal created in response to incident radiation and a second face for applying high voltage biasing means, where the bias means comprises a conductive wire which has a diameter of more than 30 um.

In accordance with a third aspect of the current invention there is provided a radiation imaging/radiation detection, direct conversion, compound semiconductor detector, said detector comprising two major faces, a first face for reading out the electronic signal created in response to incident radiation and a second face for applying high voltage biasing means, where the bias means comprises a conductor with a contact face of the conductor being more than 700 $um^2$ in area.

In accordance with a fourth aspect of the current invention there is provided a radiation imaging/radiation detection, direct conversion, compound semiconductor detector, said detector comprising two major faces, a first face for reading out the electronic signal created in response to incident radiation and a second face for applying high voltage biasing means, where the bias means comprises two or more individual conductors.

In accordance with a fifth aspect of the current invention there is provided a radiation imaging/radiation detection, direct conversion, compound semiconductor detector, comprising at least two separate detector elements, each of said detector elements comprising two major faces, a first face for reading out the electronic signal created in response to incident radiation and a second face for applying high voltage biasing means, where the second faces are daisy chained with conductor(s).

The invention finds particular application with radiation imaging/radiation detectors based on CdTe or CdZnTe.

The present invention introduces an improved detector with the connection of the high/bias voltage to the surface of a semiconductor detector done in a specific way. While the conventional connection is with a thin aluminum wire which transfers and connects the high voltage to the detector face with the continuous electrode, it has been found that in the case of CdTe and CdZnTe it may leave the detector in an unstable state causing occasional sudden changes in the detector response. The invention ensures a stable supply of the high voltage and continuously reliable detector performance.

The inventors of the present invention have found that if the high voltage connection of a pixelated CdTe imaging detector is provided with a thin aluminum wire the detector response may occasionally fall into an unstable state causing rapid changes in the output signal level. These changes can be seen, e.g., either as large and rapid base level variations (flashing or DC level fluctuation) over the complete detector area or as signal spikes in individual pixels or in localised clusters of pixels. The fundamental reason to this instability is understood to be related to crystal non-uniformities which cause charge trapping. It may also be related to the physical contact between the connection wire and the CdTe or CdZnTe surface which is covered by a metal film. Due to the fragile nature of the CdTe or CdZnTe crystal and to the properties of the metal film it is generally not possible to connect a wire to the CdTe surface by ultrasonic bonding. Instead, conductive epoxy is used. In case the surface of the aluminum wire is oxidised this may cause an unwanted electrical resistance at the contact point and lead to the observed instability.

The inventors have observed that the performance of the CdTe and CdZnTe detector remains stable if the high voltage connection is provided with a thicker wire made of copper. Similarly, a good quality high voltage connection can also be ensured by a thicker wire of some other less oxidising metal such as gold, platinum or silver. Other means of providing the high voltage can also be used such as micro springs or drops of conductive epoxy which eliminates the instability problem observed when the high voltage connection is a thin aluminum wire in the diameter range of 5 um-25 um.

DESCRIPTION OF PREFERRED EMBODIMENTS

In accordance with the current invention, the detector high/bias voltage means are suitable to ensure stable performance of the semiconductor detectors in use. Such means are explained below. These are not exclusive but examples of the invention's technique to substitute a thin aluminum wire with a conductive path that has a large enough cross section and suitable properties to guarantee a practically resistance free connection of the high/bias voltage to the continuous bias electrode on the detector surface. The electrically conductive materials introduced in these examples are believed to exhibit less severe oxidation problems than aluminum. Other conductive materials with similarly better oxidation properties than aluminum could also be used.

Figure 1:
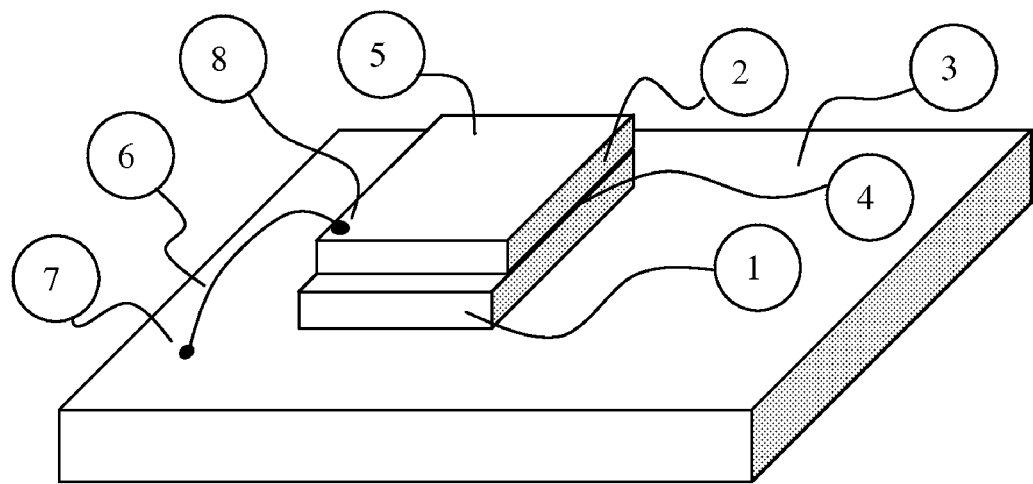
FIG. 1. The conventional method of connecting the high voltage to the top surface of a hybrid pixel detector.

FIG. 1 shows an example of the prior art and in particular the case of a hybrid semiconductor radiation imaging detector bump bonded to a readout circuit. As shown in FIG. 1, in this type of a configuration the integrated circuit (1) with the semiconductor imaging detector (2) on a top surface of the integrated circuit is mounted onto a substrate (3) such as a PCB. The substrate provides the high voltage/bias voltage that is needed by the top surface of the imaging detector (2). The low voltage or ground side (4) of the detector (2) is attached to the integrated circuit (1) typically by bump bonding or other similar means. The high voltage/bias voltage face (5) receives the radiation and, therefore, has to remain bare. The conventional method to connect the high voltage to the top face (5) to the substrate is with a thin aluminium wire (6). The aluminium wire is typically attached to the substrate (3) and to the detector surface (5) with ultrasonic bonds (7) and (8). If the detector is fragile (e.g., CdTe or CdZnTe) the bond (8) can also be realised with electrically conductive epoxy.

The inventors have found that for certain types of compound semiconductor radiation imaging detectors the conventional method of connecting the high voltage with a thin aluminum wire as shown in FIG. 1 is not suitable or ideal and may even cause significant operational problems. This invention is particularly applicable with CdTe detectors and CdZnTe detectors but may also apply to other compound semiconductor detectors such as GaAs or $HgI_2$.

Figure 2:
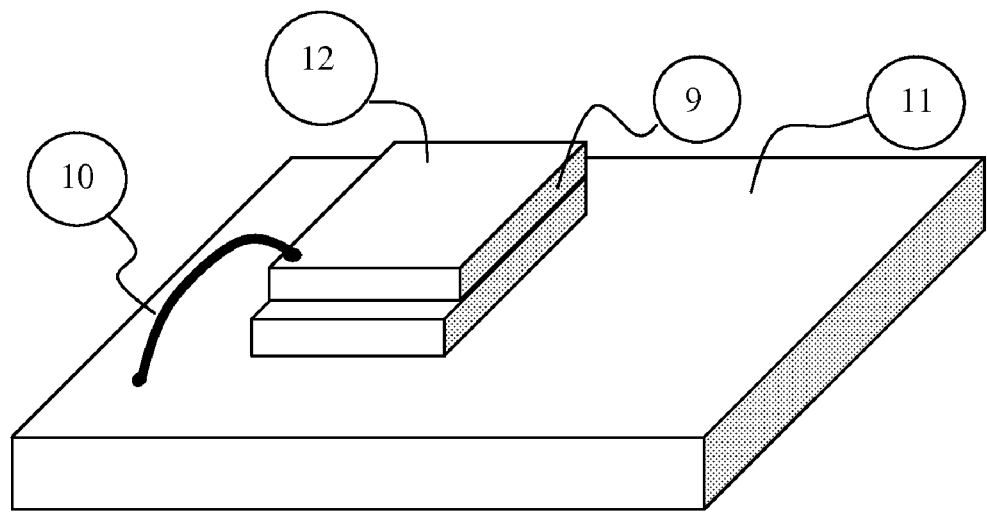
FIG. 2. An illustration of an embodiment of the invention with a thick copper wire used as a high voltage connector.

FIG. 2 shows a radiation imaging detector hybrid (9) in accordance with the current invention having a copper wire (10) as the high/bias voltage conducting means connected to the bias electrode face 12 and to the substrate (11). The copper wire is thicker than the conventional aluminum wire. Accordingly, the diameter of the copper wire is between 30 um-200 um, but can be also thicker. Preferably the copper wire has a circular cross section, but the invention includes other shapes or forms of conductors, that are not circular (or cylindrical) but have a contact face with the bias surface of the semiconductor of at least 700 um$^2$. This is the effective contact area of a 30 um circular cross section copper wire. The copper wire can be attached to the substrate (11) and to the detector bias surface (12) by, e.g., conductive epoxy. In accordance with the current invention, the material of the thicker wire can alternatively be gold, silver, platinum, conductive plastic or any other material with slow oxidation properties, i.e., an oxidation rate less than the oxidation rate of aluminium, and good electrical conductivity.

Figure 3:
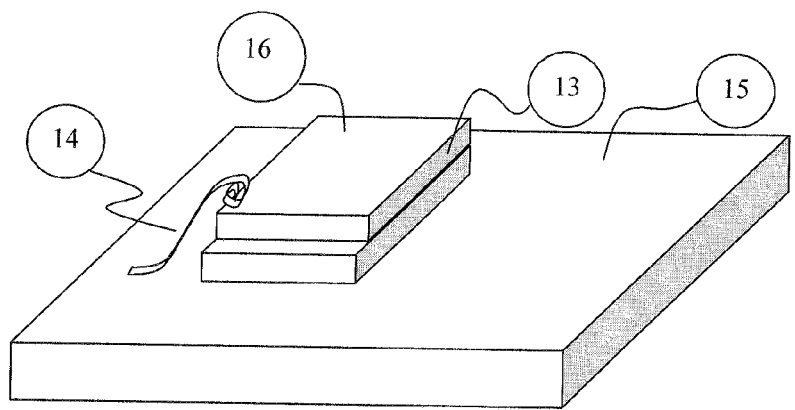
FIG. 3. An illustration of an embodiment of the invention with a micro spring used as a high voltage connector.

In accordance with another embodiment, FIG. 3 shows a detector hybrid (13) with a metal micro spring (14) as the high/bias voltage applying means. The spring (14) can be alternatively made of conductive plastic. The spring (14) can be, e.g., soldered to the substrate (15). The contact at the detector surface (16) is ensured by the mechanical pressure of the spring (14).

Figure 4:
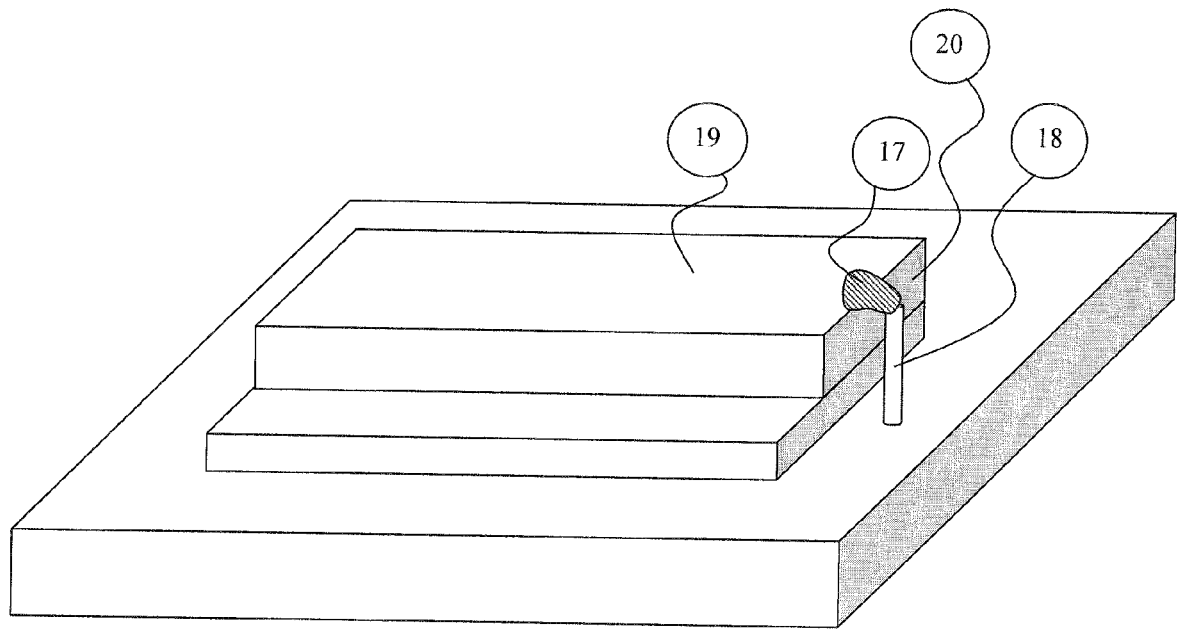
FIG. 4. An illustration of an embodiment of the invention with a drop of conductive epoxy used to connect the high voltage to the detector surface.

In accordance with another embodiment, FIG. 4 shows how a drop of conductive epoxy (17) can be used to connect the detector hybrid to the high voltage provided by the substrate. The epoxy (17) connects the high voltage pin (18), extending from the substrate, to the top detector surface (19) of the detector hybrid (20).

Figure 5:
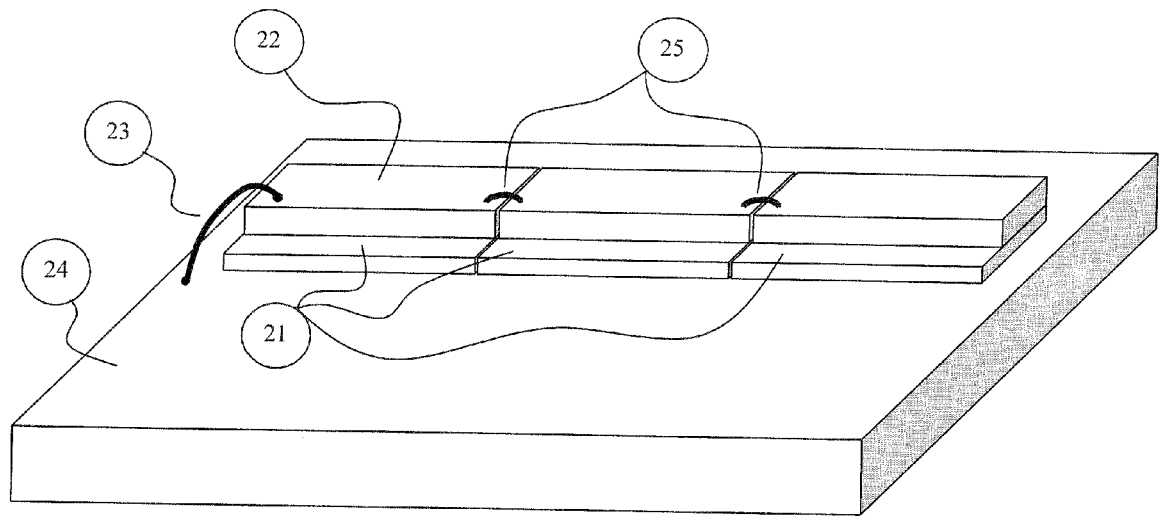
FIG. 5. An illustration of how adjacent detector elements can be chained in order to bring the high voltage to each of the elements through only one connection to the detector substrate.

In accordance with another embodiment, FIG. 5 shows how the high voltage can be connected to adjacent detector hybrids (21) which form a larger active detection area. This type of a hybrid layout is commonly used in scan imaging. The high/bias voltage in this example is brought to the surface of the first hybrid (22) with, e.g., a thick copper wire (23). Instead of applying the high/bias voltage to the rest of the hybrids by connecting their respective bias surfaces separately to the substrate (24), the bias surface of each hybrid the hybrids are chained with connections (25) which can be metal wires or stripes of thin metal sheet or drops of conductive epoxy.

Figure 6:
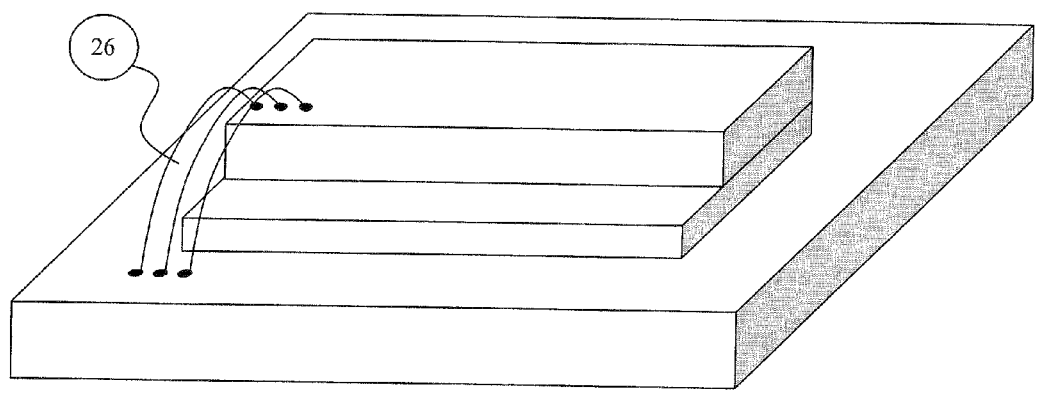
FIG. 6. An illustration of how the high voltage connection can be made stable by using two or more conductive paths between the detector substrate and top surface.

In accordance with another embodiment, FIG. 6 shows how the reliability of the high voltage connection is improved with additional metal wires. In some situations (e.g., due to production reasons) no other means than the conventional thin aluminum wire is possible as the high voltage connector. In such cases two or more wires (26) may be used to decrease the probability of the high voltage connection failure or instability.

The invention claimed is:

1. A x/gamma ray radiation imaging/radiation detection, direct conversion, compound semiconductor detector assembly, comprising:
    an x/gamma ray radiation imaging/radiation detection, direct conversion, compound semiconductor detector having two major faces, a first major face for reading out an electronic signal created in response to incident x/gamma ray radiation and a second major face for applying a high voltage; and
    a high voltage biasing means connection on the second major face providing high voltage biasing to produce an electric field inside the detector,
    wherein the bias means connection comprises one of the group consisting of i) a conductive wire having a contact face of more than 700 um² in area, and ii) a conductive wire which has a diameter of more than 30 um.

2. The assembly of claim 1, wherein the bias means connection comprises a conductive wire which has a diameter of more than 30 um and carries the high voltage biasing to produce an electric field inside the detector.

3. The assembly of claim 2, wherein the conductive wire of the bias means connection comprises a metal micro spring connection against the second major surface.

4. The assembly of claim 1, wherein the conductive wire of the bias means connection comprises a contact face being more than 700 um² in area and carries the high voltage biasing to produce an electric field inside the detector.

5. The assembly of claim 4, wherein the conductive wire of the bias means connection comprises a metal micro spring connection against the second major surface.

6. The assembly of claim 1, wherein the bias means connection comprises two or more said conductive wire, each said conductive wire carrying the high voltage biasing to produce an electric field inside the detector.

7. The assembly of claim 1, comprising:
plural of said radiation imaging/radiation detection, direct conversion, compound semiconductor detector having two major faces, a first major face for reading out an electronic signal created in response to incident radiation and a second major face,
a first of said plural detectors having said high voltage biasing means connection on the second major face providing high voltage biasing to produce an electric field inside the detector,
each other detector of said plural detectors having a high voltage biasing means connection connected with a conductor, in daisy chain, to another of said plural detectors so that the second major faces are daisy chained with conductors one second major face to another second major face.

8. The assembly of claim 1, wherein the detector is a CdTe based detector.

9. The assembly of claim 1, wherein the detector is a CdZnTe based detector.

10. The assembly of claim 1, wherein the conductive wire of the bias means connection is one of the group consisting of a gold wire conductive wire, a silver conductive wire, and a platinum conductive wire.

11. The assembly of claim 10, wherein the conductive wire of the bias means connection comprises a metal micro spring connection against the second major surface.

12. The assembly of claim 1, wherein the conductive wire of the bias means connection is a gold conductive wire that carries the high voltage biasing to produce an electric field inside the detector.

13. The assembly of claim 1, wherein the conductive wire of the bias means connection is a silver conductive wire that carries the high voltage biasing to produce an electric field inside the detector.

14. The assembly of claim 1, wherein the conductive wire of the bias means connection is a platinum conductive wire that carries the high voltage biasing to produce an electric field inside the detector.

15. The assembly of claim 1, wherein the conductive wire of the bias means connection is of an electrically conductive plastic wire.

16. The assembly of claim 1, wherein the bias means connection comprises an electrically conductive epoxy connection connected to a conductive wire of the bias means connection that carries the high voltage biasing to produce an electric field inside the detector.

17. The assembly of claim 1, wherein the bias means connection comprises an electrically conductive plastic connection connected to the conductive wire of the bias means connection that carries the high voltage biasing to produce an electric field inside the detector.

18. The assembly of claim 1, wherein the bias means connection comprises an electrically conductive rubber connection connected to the conductive wire of the bias means connection that carries the high voltage biasing to produce an electric field inside the detector.

19. The assembly of claim 1,
wherein the bias means connection comprises a conductive wire connected wire to the second major face by one of an electrically conductive epoxy connection, an electrically conductive plastic connection, and an electrically conductive rubber conductor connection.

20. A ray radiation imaging/radiation detection, direct conversion, compound semiconductor detector assembly, comprising:
plural ray radiation imaging/radiation detection, direct conversion, compound semiconductor detectors,
each detector having two major faces, a first major face for reading out an electronic signal created in response to incident radiation and a second major face for applying a high voltage; and
a high voltage biasing means connection on the second major face providing high voltage biasing to produce an electric field inside the detector,
wherein a first of said plural detectors having said high voltage biasing means connection on the second major face providing high voltage biasing to produce an electric field inside the detector, and each other detector of said plural detectors having a high voltage biasing means connection connected with a conductor, in daisy chain, to another of said plural detectors so that the second major faces are daisy chained with conductors one second major face to another second major face.

* * * * *